(12) United States Patent
Witzberger et al.

(10) Patent No.: US 9,477,795 B1
(45) Date of Patent: Oct. 25, 2016

(54) MODELING, SIMULATION, AND CONTROL OF A SOLAR ELECTRIC PROPULSION VEHICLE IN NEAR-EARTH VICINITY INCLUDING SOLAR ARRAY DEGRADATION

(71) Applicant: The United States of America as represented by the Administrator of the National Aeronautics and Space Administration, Washington, DC (US)

(72) Inventors: Kevin Witzberger, Cleveland, OH (US); Jeffery Hojnicki, Cleveland, OH (US); David Manzella, Cleveland, OH (US)

(73) Assignee: The United States of America as Represented by the Administrator of National Aeronautics and Space Administration, Washington, DC (US)

( * ) Notice: Subject to any disclaimer, the term of this patent is extended or adjusted under 35 U.S.C. 154(b) by 583 days.

(21) Appl. No.: 13/923,441

(22) Filed: Jun. 21, 2013

Related U.S. Application Data

(60) Provisional application No. 61/666,265, filed on Jun. 29, 2012.

(51) Int. Cl.
*G06F 17/50* (2006.01)
(52) U.S. Cl.
CPC .................... *G06F 17/5009* (2013.01)
(58) Field of Classification Search
USPC ......... 703/2, 18; 244/158.2, 158.3, 158.5, 2, 244/172.4
See application file for complete search history.

(56) References Cited

U.S. PATENT DOCUMENTS

| 4,730,797 | A | * | 3/1988 | Minovitch | B64G 9/00 244/158.3 |
|---|---|---|---|---|---|
| 4,815,443 | A | * | 3/1989 | Vrolyk | B64G 1/446 126/694 |
| 5,092,780 | A | | 3/1992 | Vlach | |
| 5,435,725 | A | | 7/1995 | Ikeuchi | |
| 5,909,381 | A | | 6/1999 | Shome et al. | |
| 6,011,913 | A | | 1/2000 | Claffey et al. | |
| 6,193,194 | B1 | * | 2/2001 | Minovitch | B64G 1/405 244/1 R |
| 6,256,602 | B1 | | 7/2001 | Ellis et al. | |
| 6,496,741 | B1 | * | 12/2002 | Whiffen | G05B 13/024 244/158.1 |
| 6,859,769 | B1 | | 2/2005 | Tanygin | |
| 6,937,968 | B1 | | 8/2005 | Carrico et al. | |
| 7,113,851 | B1 | * | 9/2006 | Gelon | B64G 1/007 244/158.5 |
| 7,650,268 | B2 | | 1/2010 | Tillotson | |

(Continued)

*Primary Examiner* — Thai Phan
(74) *Attorney, Agent, or Firm* — Robert H. Earp, III

(57) ABSTRACT

Modeling and control software that integrates the complexities of solar array models, a space environment, and an electric propulsion system into a rigid body vehicle simulation and control model is provided. A rigid body vehicle simulation of a solar electric propulsion (SEP) vehicle may be created using at least one solar array model, at least one model of a space environment, and at least one model of a SEP propulsion system. Power availability and thrust profiles may be determined based on the rigid body vehicle simulation as the SEP vehicle transitions from a low Earth orbit (LEO) to a higher orbit or trajectory. The power availability and thrust profiles may be displayed such that a user can use the displayed power availability and thrust profiles to determine design parameters for an SEP vehicle mission.

20 Claims, 4 Drawing Sheets

(56) References Cited

U.S. PATENT DOCUMENTS

| | | | |
|---|---|---|---|
| 7,762,498 B1 * | 7/2010 | Henderson | B64G 1/401 244/171.1 |
| 7,979,255 B2 | 7/2011 | Hanke et al. | |
| 8,668,161 B2 * | 3/2014 | Heppe | B64B 1/54 244/2 |
| 2005/0209835 A1 | 9/2005 | Ih | |
| 2009/0101757 A1 * | 4/2009 | Brandhorst, Jr. | B64G 1/007 244/172.4 |
| 2010/0318336 A1 | 12/2010 | Falangas | |
| 2013/0037650 A1 * | 2/2013 | Heppe | B64C 37/02 244/2 |
| 2015/0041594 A1 * | 2/2015 | Hickman | B64G 1/007 244/158.2 |

* cited by examiner

MODELING, SIMULATION, AND CONTROL OF A SOLAR ELECTRIC PROPULSION VEHICLE IN NEAR-EARTH VICINITY INCLUDING SOLAR ARRAY DEGRADATION

CROSS REFERENCE TO RELATED APPLICATION

This application is a non-provisional of, and claims priority to, U.S. Provisional Patent Application Ser. No. 61/666,265 filed Jun. 29, 2012. The subject matter of this earlier-filed application is hereby incorporated by reference in its entirety.

ORIGIN OF THE INVENTION

The invention described herein was made by employees of the United States Government and may be manufactured and used by or for the Government for Government purposes without the payment of any royalties thereon or therefore.

The invention described herein was also made in the performance of work under a NASA contract and is subject to the provisions of Section 305 of the National Aeronautics and Space Action of 1958, Public Law 85-568 (72 Stat. 435; 42 U.S.C. 2457).

FIELD

The present invention generally pertains to modeling and control software, and more specifically, to modeling and control software that integrates the complexities of solar array models, a space environment, and an electric propulsion system into a rigid body vehicle simulation and control model.

BACKGROUND

In certain space applications, it is desirable to use a vehicle that delivers a payload from an initial orbit to a final, higher orbit around Earth, or a trajectory that will send the payload beyond Earth. Such a vehicle may be a solar electric propulsion (SEP) vehicle that is capable of collecting and storing solar energy as electrical energy, and then using the electrical energy to power an electric propulsion system. To design a SEP vehicle capable of performing such a mission, vehicle designers are required to size the power and propulsion system appropriately. This sizing is influenced by the attitude and thrust vector of the vehicle, which necessitates an iterative design approach that quantifies the transfer time, the amount of propellant consumed, the number of on/off cycles of the electric thrusters, and other key vehicle design parameters. For SEP systems, the amount of power available at any given time is critical to effective modeling. The amount of power available to the thruster is calculated in situ.

Conventional SEP simulations exist, but specialize in trajectory optimization for interplanetary and primitive body science missions. For these science missions, such as Dawn and Deep Space I, the SEP part of the mission takes place in heliocentric space, where power produced by the vehicle's solar arrays is relatively constant, changing only very slowly with time as the solar arrays degrade or the distance from the sun changes (time constants on the order of months). Therefore, these computer programs do not contain detailed power system models since such models are not needed for these specialized applications.

However, for missions that spend significant amounts of time in the Earth's vicinity (i.e., starting in low Earth orbit (LEO)), detailed power system models, including solar array degradation, are essential. Conventionally, a methodology is employed to perform the required analysis that requires substantial time and manpower, and is extremely limited in modeling the entire vehicle as an integrated system. Such a conventional, iterative methodology 100 is shown in FIG. 1. Multiple software programs are utilized and decoupled from one another. These programs included a trajectory simulation program with simplified power and propulsion models and a power program with simplified trajectory data.

Neither program outputs data that can be used in a seamless manner as input into the other program. Both programs have to simplify the output data of the other program to be amenable as input data, which requires significant time and is error prone. This procedure takes weeks to complete a single iteration cycle and to result in somewhat consistent power and trajectory data. Additionally, the conventional methodology could not permit important trade studies to be performed. A preliminary vehicle design is simply not feasible using the old methodology because there is so much uncertainty in key vehicle design parameters. Accordingly, improved modeling, simulation, and control for SEP vehicles may be beneficial.

SUMMARY

Certain embodiments of the present invention may be implemented and provide solutions to the problems and needs in the art that have not yet been fully solved by conventional SEP simulation and control systems. For example, in some embodiments, In one embodiment of the present invention, a computer-implemented method includes creating, by a computing system, a rigid body vehicle simulation of a SEP vehicle using at least one solar array model, at least one model of a space environment, and at least one model of a SEP propulsion system. The computer-implemented method also includes determining, by the computing system, power availability and thrust profiles based on the rigid body vehicle simulation as the SEP vehicle transitions from a low Earth orbit (LEO) to a higher orbit or trajectory. The computer-implemented method further includes displaying, by the computing system, the power availability and thrust profiles such that a user can use the displayed power availability and thrust profiles to determine design parameters for an SEP vehicle mission.

In another embodiment of the present invention, a computer program is embodied on a computer-readable medium. The program is configured to cause at least one processor to create a rigid body vehicle simulation of a SEP vehicle using at least one model of a space environment and at least one model of a SEP propulsion system. The program is also configured to cause the at least one processor to determine power availability and thrust profiles based on the rigid body vehicle simulation as the SEP vehicle transitions from LEO to a higher orbit or trajectory. The program is further configured to cause the at least one processor to display, on a display device, thrust profiles such that a user can use the displayed thrust profiles to determine design parameters for an SEP vehicle mission.

In yet another embodiment of the present invention, an apparatus includes memory storing computer program instructions and at least one processor configured to execute the computer program instructions. The at least one processor is configured to create a rigid body vehicle simulation of a SEP vehicle using at least one model of a SEP propulsion system and determine power availability and thrust profiles based on the rigid body vehicle simulation as the SEP vehicle transitions from LEO to a higher orbit or trajectory. The at least one processor is also configured to display, on a display device, the power availability and thrust profiles such that a user can use the displayed power availability and thrust profiles to determine design parameters for an SEP vehicle mission.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Figure 1:
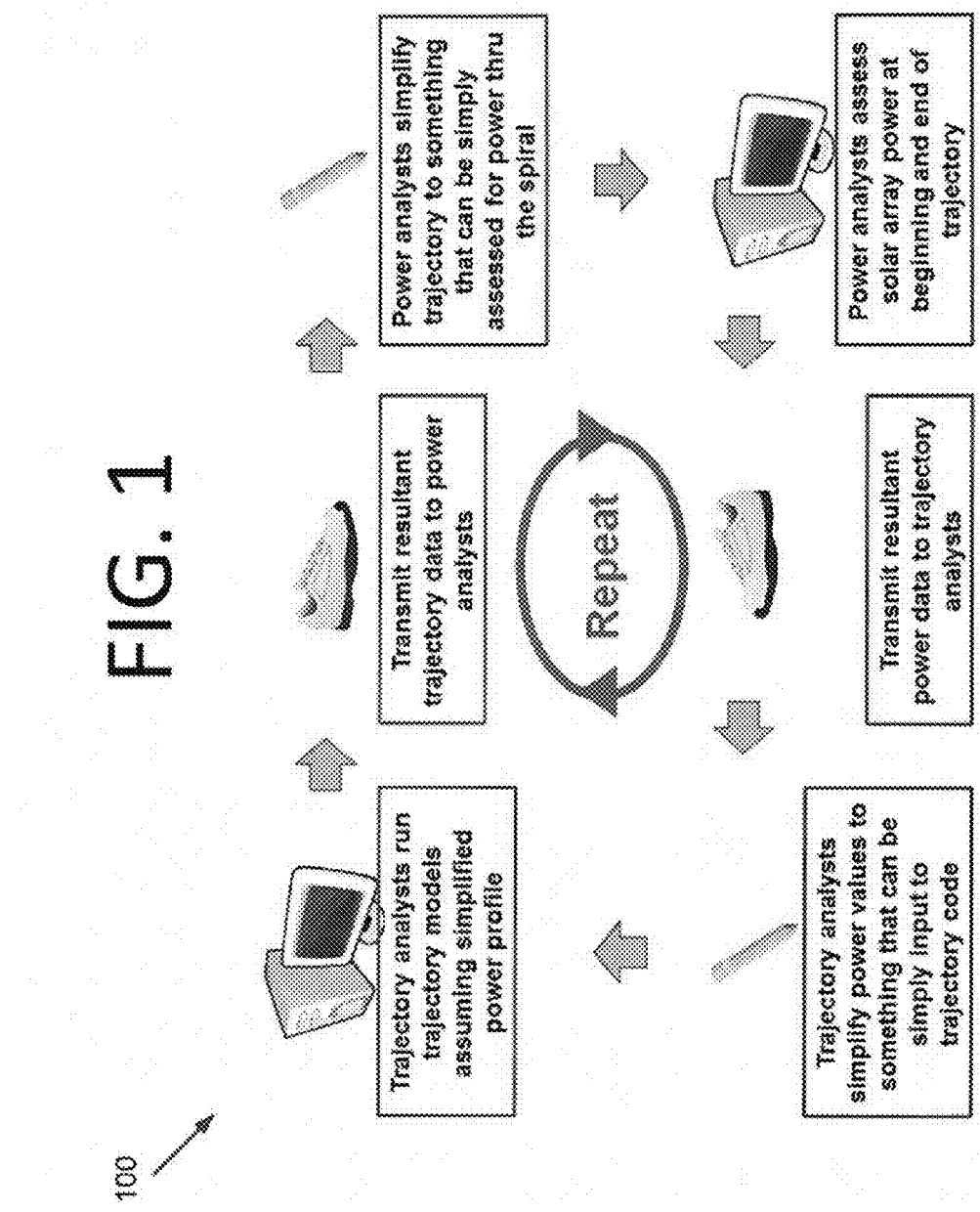
FIG. 1 illustrates the conventional iterative design process for analyzing Earth spiral trajectory.

Some embodiments of the present invention model an entire solar electric propulsion vehicle as it transfers from one orbit to another in a rigid body vehicle simulation model. More specifically, the complexities of solar array models, the space environment, and the electric propulsion system may be integrated into the rigid body vehicle simulation model. As a result, this software may model a low-thrust SEP vehicle during its transfer from a selected initial orbit to a selected final orbit in the vicinity of Earth or beyond. Solar array degradation, as a result of exposure to the Earth's Van Allen belt radiation, is a feature that may be modeled in some embodiments.

The fidelity of the software in some embodiments is flexible enough to accommodate early conceptual design studies that would require low-fidelity and detailed vehicle design in support of a flight project that would require high-fidelity. Such embodiments may result in more accurate performance assessments of a SEP vehicle, serving as a critical component in establishing baseline SEP vehicle performance requirements. Additionally, such embodiments may enable the assessment of new trade studies, such as variations in the actual operation of the electric propulsion system.

In order to effectively design or simulate the performance of a SEP vehicle spiraling out of low Earth orbit (LEO), a tool should incorporate at least: (1) guidance and navigation; (2) control for three or six degrees of freedom simulations; (3) detailed solar array performance modeling; (4) radiation fluence modeling; (5) detailed electric propulsion thruster modeling; (6) the ability to numerically solve the rigid body equations of motion; (7) input/output records; and (8) environment modeling that includes the Earth/sun shadowing geometry. Furthermore, to accurately model a low-thrust solar powered transfer, passages through Earth's shadow, solar array degradation, drag in low Earth orbit, in-plane and out-of-plane steering, and the electric propulsion system should all be modeled and coupled as appropriate. Currently, no such tool exists. For such design and simulation, power generated by the solar arrays varies not on the order of months, but on the order of minutes. Power varies significantly with variables such as solar array temperature changes as the vehicle orbits the Earth, pointing conditions of the arrays as the solar beta angle (i.e., the angle between the orbit plane and Earth-Sun vector) varies or vehicle orientation changes (i.e., the large range of beta angles could result in solar array off-pointing or spacecraft shadowing of the solar arrays during some portion of the mission), and mission time as the solar arrays degrade substantially when the spacecraft passes through the Earth's Van Allen belts. In addition, in order to effectively design or simulate the performance of an SEP system in direct-drive operation where the solar array output is coupled directly to the thruster input, the current and voltage characteristics should be predicted, in addition to power.

Some embodiments are novel in that they incorporate the solar array power model, electric propulsion model, and guidance algorithms as part of the overall vehicle model, unlike conventional approaches. Each of these three systems (power, propulsion, and guidance) is tightly coupled to the others, meaning that the performance of any one of those systems depends on the others. The complexities involved require the use of numerical computer simulation software, and this problem cannot be solved analytically by individuals. As the vehicle transfers from one orbit to another, the position, velocity, and orientation of the vehicle changes. From here on, the vehicle's position, velocity, and orientation are referred to as "states."

Figure 2:
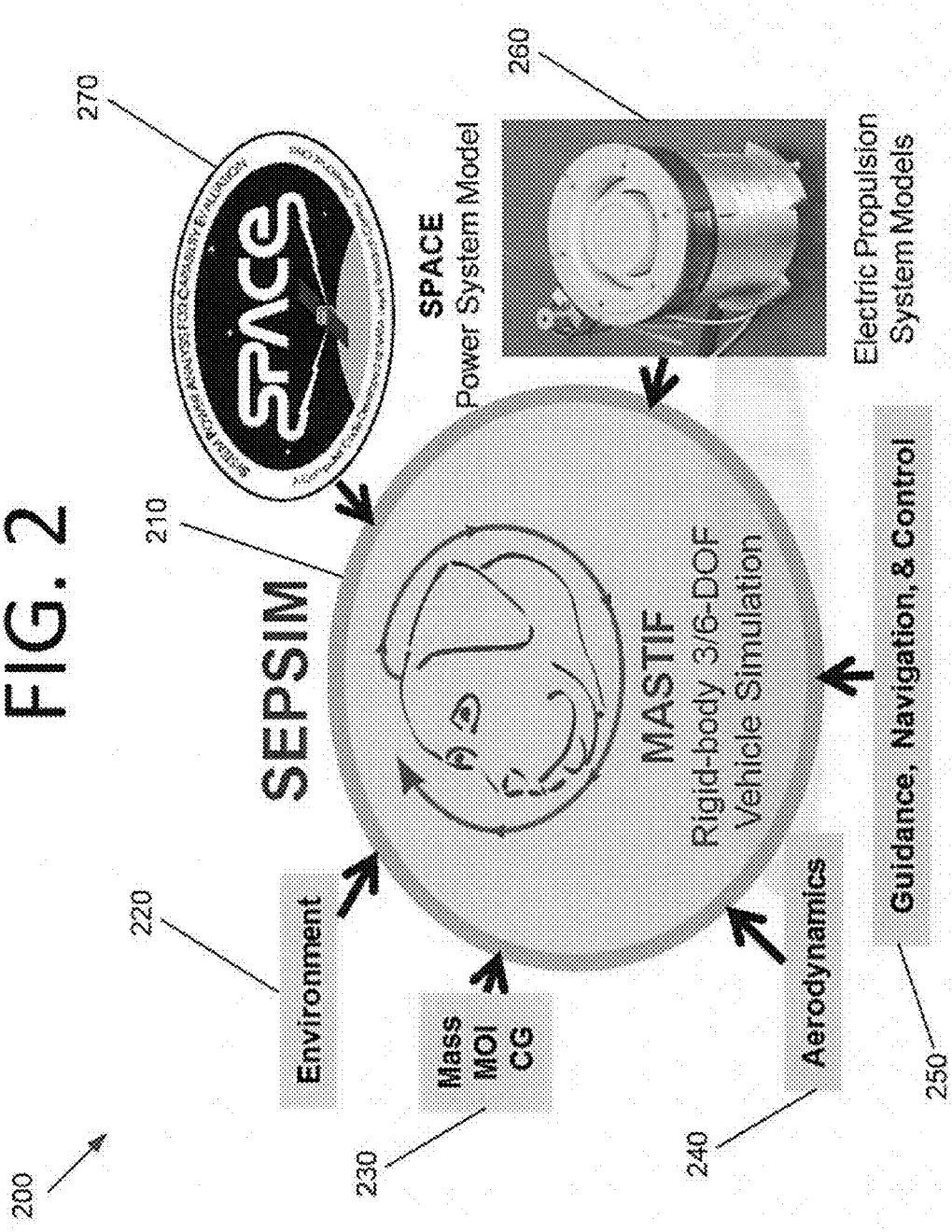
FIG. 2 illustrates components and inputs for a SEP simulation (SEPSIM) system, according to an embodiment of the present invention.

Changes in the vehicle's states occur for many reasons, including, but not limited to, atmospheric drag at low altitudes, power degradation due to radiation damaged solar cells as it passes through the Van Allen radiation belts, and solar ellipses due to the Earth blocking sunlight. Some embodiments are able to account for all of these effects. The SEPSIM system 200 is shown in FIG. 2.

The core of SEPSIM 200 is the Mission Analysis Simulation Tool in Fortran (MASTIF) 210, which receives various inputs. These inputs include data pertaining to the environment 220, Mass MOI CG 230 (i.e., vehicle mass, moments of inertia, and center of gravity), aerodynamics 240 including, but not limited to, drag in LEO, guidance, navigation, and control 250, electric propulsion system models 260, and power system models based on System Power Analysis for Capability Evaluation (SPACE) 270, a NASA-developed model that predicts the performance of spacecraft power systems that are powered by photovoltaic solar arrays. Data pertaining to environment 220 may include radiation and atmospheric conditions (if applicable) including, but not limited to, temperature and density. Aerodynamics guidance, navigation, and control 250 is responsible for safely and efficiently transferring the vehicle to its desired destination. This generally includes generating attitude commands to control the thrust vector and orientation of the solar arrays to harvest as much solar power as possible.

SPACE 270 provides information pertaining to solar array power, temperature, and pointing, as well as radiation fluence calculations. This is combined into a stand-alone subroutine called from MASTIF 210. The solar array model may include 300 kWe-class array models planned for a future asteroid mission, or any other suitable models for other missions.

MASTIF 210 is a low-to-high fidelity vehicle simulation program. MASTIF 210 adds roll steering to available guidance modes. The guidance system is responsible for steering the vehicle in a safe and efficient manner. In usual practice, an efficient transfer from one orbit to another means minimizing fuel consumed within some mission time constraint. To achieve this fuel-efficient transfer, the guidance system manipulates the thrust vector, resulting in pitch and yaw commands. For a SEP vehicle, the orientation of the arrays relative to the sun is critical. When the guidance system also generates roll commands ("roll steering") to maximize sunlight exposure to the arrays, more power is available to the electric propulsion system than would be if the roll channel were un-commanded and allowed to drift. Roll steering is a specialized vehicle attitude that maintains the solar array alignment with the sun vector while simultaneously keeping the vehicle thrust axis aligned with the velocity vector. In some embodiments, MASTIF 210 is compiled with commercial Fortran compilers on a Linux operating system (OS) to create an executable file. MASTIF 210 may be an input file driven program, meaning that the same executable file can be used to run the program when changes are made to input files. Various column-delimited output files may be generated. These output files may contain the time history of each variable. Additionally, these output files may be customized by specifying the numeric precision and output frequency.

The power system model in some embodiments is of sufficient fidelity to predict, in time increments as small as a few seconds, the temperature of the solar array and accurately predict the current and voltage characteristics of the solar array. To achieve this level of fidelity, MASTIF 210 uses SPACE 270. SPACE 270 includes detailed electrical and thermal models that can accurately predict solar array performance. It also models self-shadowing of the solar arrays by other spacecraft structures and has been validated against telemetry data from existing spacecraft, such as the International Space Station. Its architecture supports multiple vehicle system models in a "plug-and-play" manner that includes the SPACE-derived solar array power system model.

SEPSIM 200 enables previously unattainable vehicle system trade studies. For example, the tradeoffs of various electric propulsion (EP) system operating modes can be assessed when operating in direct-drive mode. In direct-drive mode, the solar array and thrusters are tied together directly without an intervening power processing unit. In such a mode, constant voltage, constant current, and peak power operating modes are all possible and may produce differing system performance, which can only be studied when the simulation includes a detailed model of the solar array performance. Other trade studies, including roll steering variations and power processing variations, are also possible. Additionally, SEPSIM 200 enables hardware design requirements to be determined. The number and duration of each thruster's on/off cycles are an example of such requirements. Finally, SEPSIM 200 enables faster and more accurate vehicle design assessments when compared to conventional techniques.

The fidelity of SEPSIM 200 is flexible and may be increased based on the needs of current and future projects. For preliminary design studies, a three degrees of freedom simulation is sufficient to scope the major design variables such the mass of the propellant consumed, transfer time, and solar array power, among others. When increased fidelity of the vehicle simulation is required, a control system can be added to the guidance and navigation components, resulting in a six degree of freedom simulation. The control effectors of the solar arrays can also be modeled as required. The capabilities of SEPSIM 200 can be readily extended to include orbital space debris/avoidance strategies, propellant slosh, and flexible body dynamics. These additional models are readily achievable by using existing defined interfaces, allowing previous models to be reused or modified, or by generating entirely new models. Additionally, vehicles that include high thrust and low thrust as main propulsion systems can be assessed.

SEPSIM 200 provides the ability to accurately predict solar array temperature, current, and voltage as a function of spacecraft position, age, orientation, and pointing conditions. The SEPSIM 200 also provides the ability to: (1) determine the effects of shadowing from spacecraft structures onto the solar array as a function of spacecraft orientation; (2) accumulate radiation doses throughout the trajectory and track the associated solar array degradation during the simulation; (3) model electric propulsion systems utilizing either direct-drive or traditional power processing unit architectures; (4) determine thruster specific impulse ($I_{sp}$) as a function of solar array voltage in direct drive mode; and (5) model various electric propulsion modes, including constant current operation, constant voltage operation, or peak-power tracking. Shadowing from spacecraft structures, which can significantly impact solar array performance in certain vehicle attitudes, is a feature present in SPACE 270 and can be implemented in some embodiments.

Because spiraling through the Earth's radiation belts induces significant degradation, power losses over the mission can amount to 30% or more. SEPSIM 200 also integrates radiation environment models so that degradation can be calculated by the model in-situ as the vehicle spirals through the belts and radiation damage is accumulated. The AP-8/AE-8 radiation models as implemented in the NASA-developed RADBELT tool may be used, for instance. These models have been made freely available by NASA. RADBELT is a stand-alone model controlled by menu-driven inputs selected by the user. For some embodiments, RADBELT was modified substantially to be integrated into SEPSIM 200 and take inputs from other SEPSIM 200 modules, rather than from the user.

Figure 3:
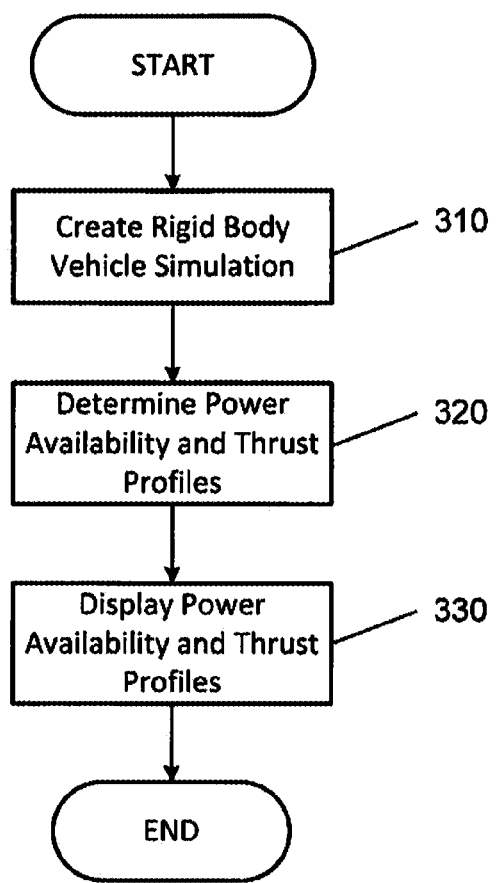
FIG. 3 is a flowchart illustrating a method for simulating SEP vehicle performance, according to an embodiment of the present invention.

FIG. 3 is a flowchart 300 illustrating a method for simulating SEP vehicle performance, according to an embodiment of the present invention. In some embodiments, the method of FIG. 3 may be implemented, for example, by computing system 400 of FIG. 4. The method begins with creating a rigid body vehicle simulation of a SEP vehicle at 310 using at least one solar array model, at least one model of a space environment, and at least one model of a SEP propulsion system. In some embodiments, the rigid body vehicle simulation is configured to incorporate guidance, navigation, and control for six degrees of freedom, solar array performance modeling, radiation fluence modeling, and electric propulsion thruster modeling.

In certain embodiments, the rigid body vehicle simulation is configured to model and couple a low-thrust solar powered transfer, passages through Earth's shadow, solar array degradation, drag in low Earth orbit, and in-plane and out-of-plane steering. The rigid body vehicle simulation may also be configured to incorporate and account for power variations that occur on the order of minutes. The rigid body vehicle simulation may be configured to account for power variations due to solar array temperature changes as the SEP vehicle orbits the Earth, pointing conditions of solar arrays as a solar beta angle varies or vehicle orientation changes, and mission time as the solar arrays degrade when the SEP vehicle passes through the Earth's Van Allen belts.

Various other operational effects may also be modeled. For example, effects of shadowing from spacecraft structures onto solar arrays may be determined as a function of spacecraft orientation, radiation doses may be accumulated throughout the trajectory and tracking the associated solar array degradation during the simulation, SEP propulsion may be modeled utilizing either direct-drive or traditional power processing unit architectures, thruster specific impulse (Isp) may be determined as a function of solar array voltage in direct drive mode, and/or electric propulsion modes including constant current operation, constant voltage operation, and/or peak-power tracking may be modeled.

Power availability and thrust profiles are determined at 320 based on the rigid body vehicle simulation as the SEP vehicle transitions from a low Earth orbit (LEO) to a higher orbit or trajectory. The power availability and thrust profiles are then displayed at 330 such that a user (e.g., a flight systems engineer) can use the displayed power availability and thrust profiles to determine design parameters for an SEP vehicle mission. For instance, the user may determine the size of the solar arrays and the power of the SEP propulsion system based on the modeling.

Figure 4:
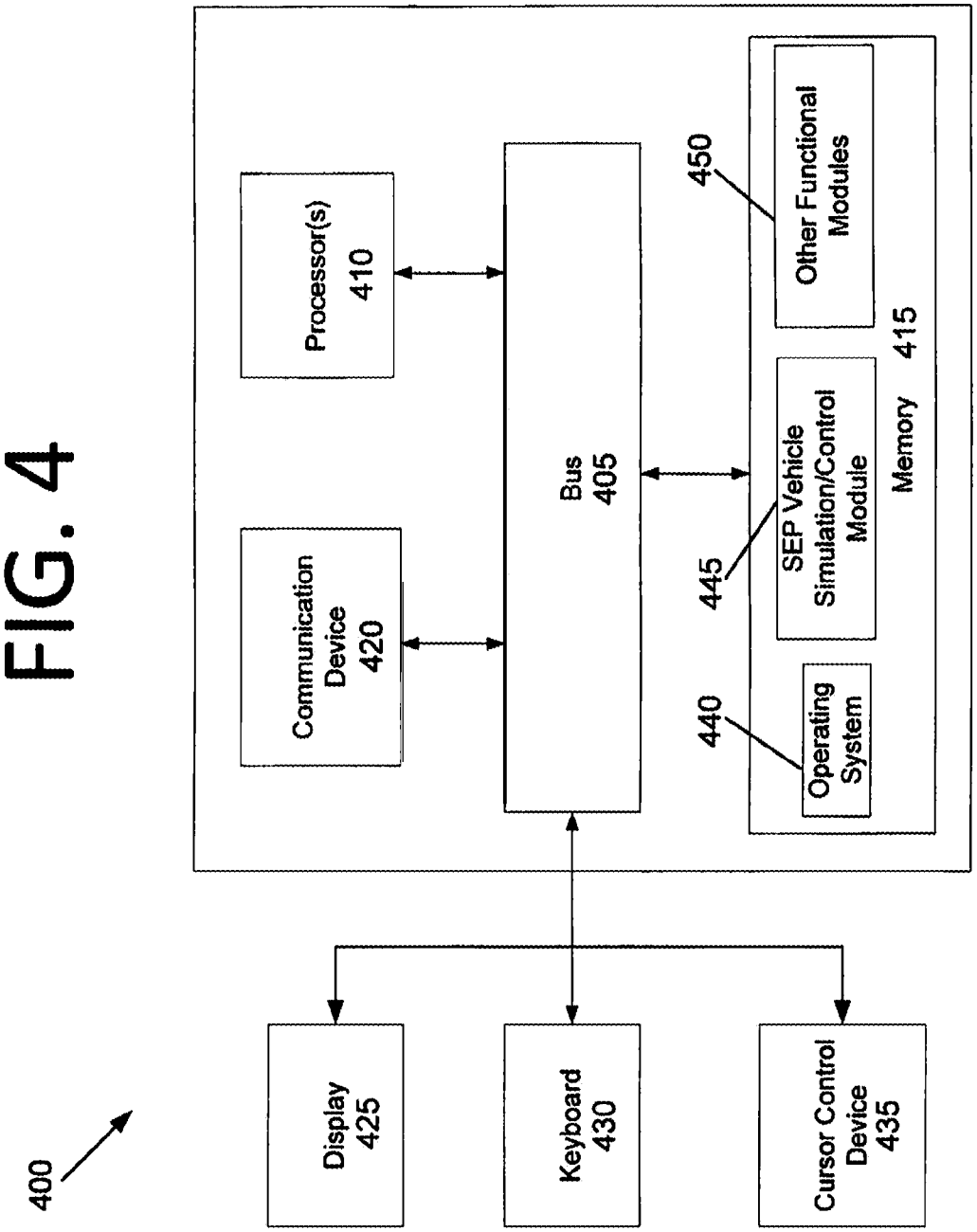
FIG. 4 is a block diagram illustrating a computing system configured to perform SEP simulation and/or control, according to an embodiment of the present invention.

FIG. 4 is a block diagram illustrating a computing system 400 configured to perform SEP simulation and/or control, according to an embodiment of the present invention. Computing system 400 includes a bus 405 or other communication mechanism for communicating information, and processor(s) 410 coupled to bus 405 for processing information. Processor(s) 410 may be any type of general or specific purpose processor, including a central processing unit ("CPU") or application specific integrated circuit ("ASIC"). Processor(s) 410 may also have multiple processing cores, and at least some of the cores may be configured to perform specific functions. Computing system 400 further includes a memory 415 for storing information and instructions to be executed by processor(s) 410. Memory 415 can be comprised of any combination of random access memory ("RAM"), read only memory ("ROM"), flash memory, cache, static storage such as a magnetic or optical disk, or any other types of non-transitory computer-readable media or combinations thereof. Additionally, computing system 400 includes a communication device 420, such as a transceiver, to wirelessly provide access to a communications network.

Non-transitory computer-readable media may be any available media that can be accessed by processor(s) 410 and may include both volatile and non-volatile media, removable and non-removable media, and communication media. Communication media may include computer-readable instructions, data structures, program modules or other data in a modulated data signal such as a carrier wave or other transport mechanism and includes any information delivery media.

Processor(s) 410 are further coupled via bus 405 to a display 425, such as a Liquid Crystal Display ("LCD"), for displaying information to a user. A keyboard 430 and a cursor control device 435, such as a computer mouse, are further coupled to bus 405 to enable a user to interface with computing system 400. However, in certain embodiments such as those implemented onboard a spacecraft, a physical keyboard and mouse may not be present, and computing system 400 may be included as a component of the system, or otherwise configured to monitor and interact with the system.

In one embodiment, memory 415 stores software modules that provide functionality when executed by processor(s) 410. The modules include an operating system 440 for computing system 400. The modules further include a SEP vehicle simulation/control module that is configured to perform SEP simulation and/or control using one or more embodiments of the present invention. Computing system 400 may include one or more additional functional modules 450 that include additional functionality.

One skilled in the art will appreciate that a "system" could be embodied as a personal computer, a server, a console, a personal digital assistant ("PDA"), a cell phone, a tablet computing device, an embedded chip, or any other suitable computing device, or combination of devices. Presenting the above-described functions as being performed by a "system" is not intended to limit the scope of the present invention in any way, but is intended to provide one example of many embodiments of the present invention. Indeed, methods, systems and apparatuses disclosed herein may be implemented in localized and distributed forms consistent with computing technology, including cloud computing systems.

It should be noted that some of the system features described in this specification have been presented as modules, in order to more particularly emphasize their implementation independence. For example, a module may be implemented as a hardware circuit comprising custom very large scale integration ("VLSI") circuits or gate arrays, off-the-shelf semiconductors such as logic chips, transistors, or other discrete components. A module may also be implemented in programmable hardware devices such as field programmable gate arrays, programmable array logic, programmable logic devices, graphics processing units, or the like.

A module may also be at least partially implemented in software for execution by various types of processors. An identified unit of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module. Further, modules may be stored on a computer-readable medium, which may be, for instance, a hard disk drive, flash device, RAM, tape, or any other such medium used to store data.

Indeed, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

The method steps performed in FIG. 4 may be performed by a computer program, encoding instructions for the non-linear adaptive processor to perform at least the method described in FIG. 4, in accordance with embodiments of the present invention. The computer program may be embodied on a non-transitory computer-readable medium. The computer-readable medium may be, but is not limited to, a hard disk drive, a flash device, a random access memory, a tape, or any other such medium used to store data. The computer program may include encoded instructions for controlling the nonlinear adaptive processor to implement the method described in FIG. 4, which may also be stored on the computer-readable medium. The computer program can be implemented in hardware, software, or a hybrid implementation. The computer program can be composed of modules that are in operative communication with one another, and which are designed to pass information or instructions to display. The computer program can be configured to operate on a general purpose computer, or an ASIC.

It will be readily understood that the components of various embodiments of the present invention, as generally described and illustrated in the figures herein, may be arranged and designed in a wide variety of different configurations. Thus, the detailed description of the embodiments of the systems, apparatuses, methods, and computer programs of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable mariner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A computer-implemented method, comprising:
creating, by a computing system, a rigid body vehicle simulation of a solar electric propulsion (SEP) vehicle using at least one solar array model, at least one model of a space environment, and at least one model of a SEP propulsion system;
determining, by the computing system, power availability and thrust profiles based on the rigid body vehicle simulation as the SEP vehicle transitions from a low Earth orbit (LEO) to a higher orbit or trajectory; and
displaying, by the computing system, the power availability and thrust profiles such that a user can use the displayed power availability and thrust profiles to determine design parameters for an SEP vehicle mission.

2. The computer-implemented method of claim 1, wherein the rigid body vehicle simulation is configured to incorporate guidance, navigation, and control for three or six degrees of freedom simulations, solar array performance modeling, radiation fluence modeling, electric propulsion thruster modeling, numerically solving rigid body equations of motion, and environment modeling comprising an Earth/sun shadowing geometry.

3. The computer-implemented method of claim 1, wherein the rigid body vehicle simulation is configured to model and couple a low-thrust solar powered transfer, passages through Earth's shadow, solar array degradation, drag in low Earth orbit, and in-plane and out-of-plane steering.

4. The computer-implemented method of claim 1, wherein the rigid body vehicle simulation is configured to incorporate and account for power variations that occur on the order of minutes.

5. The computer-implemented method of claim 4, wherein the rigid body vehicle simulation is configured to account for power variations due to solar array temperature changes as the SEP vehicle orbits the Earth, pointing conditions of solar arrays as a solar beta angle varies or vehicle orientation changes, and mission time as the solar arrays degrade when the SEP vehicle passes through the Earth's Van Allen belts.

6. The computer-implemented method of claim 1, further comprising:
determining, by the computing system, effects of shadowing from spacecraft structures onto solar arrays as a function of spacecraft orientation; and/or
accumulating, by the computing system, radiation doses throughout the trajectory and tracking the associated solar array degradation during the simulation.

7. The computer-implemented method of claim 1, further comprising:
modeling, by the computing system, SEP propulsion utilizing either direct-drive or traditional power processing unit architectures;
determining, by the computing system, thruster specific impulse ($I_{sp}$) as a function of solar array voltage in direct drive mode; and/or
modeling, by the computing system, electric propulsion modes comprising constant current operation, constant voltage operation, and/or peak-power tracking.

8. A computer program embodied on a computer-readable medium, the program configured to cause at least one processor to:

create a rigid body vehicle simulation of a solar electric propulsion (SEP) vehicle using at least one model of a space environment and at least one model of a SEP propulsion system;

determine power availability and thrust profiles based on the rigid body vehicle simulation as the SEP vehicle transitions from a low Earth orbit (LEO) to a higher orbit or trajectory; and display, on a display device, thrust profiles such that a user can use the displayed thrust profiles to determine design parameters for an SEP vehicle mission.

9. The computer program of claim 8, wherein the rigid body vehicle simulation is configured to incorporate guidance, navigation, and control for three or six degrees of freedom simulations, solar array performance modeling, radiation fluence modeling, electric propulsion thruster modeling, numerically solving rigid body equations of motion, and environment modeling comprising an Earth/sun shadowing geometry.

10. The computer program of claim 8, wherein the rigid body vehicle simulation is configured to model and couple a low-thrust solar powered transfer, passages through Earth's shadow, solar array degradation, drag in low Earth orbit, and in-plane and out-of-plane steering.

11. The computer program of claim 8, wherein the rigid body vehicle simulation is configured to incorporate and account for power variations that occur on the order of minutes.

12. The computer program of claim 11, wherein the rigid body vehicle simulation is configured to account for power variations due to solar array temperature changes as the SEP vehicle orbits the Earth, pointing conditions of solar arrays as a solar beta angle varies or vehicle orientation changes, and mission time as the solar arrays degrade when the SEP vehicle passes through the Earth's Van Allen belts.

13. The computer program of claim 8, the program further configured to cause the at least one processor to:

determine effects of shadowing from spacecraft structures onto solar arrays as a function of spacecraft orientation; and/or accumulate radiation doses throughout the trajectory and tracking the associated solar array degradation during the simulation.

14. The computer program of claim 8, the program further configured to cause the at least one processor to:

model SEP propulsion utilizing either direct-drive or traditional power processing unit architectures;

determine thruster specific impulse ($I_{sp}$) as a function of solar array voltage in direct drive mode; and/or model electric propulsion modes comprising constant current operation, constant voltage operation, and/or peak-power tracking.

15. An apparatus, comprising:
memory storing computer program instructions; and
at least one processor configured to execute the computer program instructions, the at least one processor configured to:

create a rigid body vehicle simulation of a solar electric propulsion (SEP) vehicle using at least one model of a SEP propulsion system, determine power availability and thrust profiles based on the rigid body vehicle simulation as the SEP vehicle transitions from a low Earth orbit (LEO) to a higher orbit or trajectory, and display, on a display device, the power availability and thrust profiles such that a user can use the displayed power availability and thrust profiles to determine design parameters for an SEP vehicle mission.

16. The apparatus of claim 15, wherein the rigid body vehicle simulation is configured to incorporate guidance, navigation, and control for three or six degrees of freedom simulations, solar array performance modeling, radiation fluence modeling, electric propulsion thruster modeling, numerically solving rigid body equations of motion, and environment modeling comprising an Earth/sun shadowing geometry.

17. The apparatus of claim 15, wherein the rigid body vehicle simulation is configured to incorporate and account for power variations that occur on the order of minutes.

18. The apparatus of claim 17, wherein the rigid body vehicle simulation is configured to account for power variations due to solar array temperature changes as the SEP vehicle orbits the Earth, pointing conditions of solar arrays as a solar beta angle varies or vehicle orientation changes, and mission time as the solar arrays degrade when the SEP vehicle passes through the Earth's Van Allen belts.

19. The apparatus of claim 15, wherein the at least one processor is further configured to:

determine effects of shadowing from spacecraft structures onto solar arrays as a function of spacecraft orientation; and/or accumulate radiation doses throughout the trajectory and tracking the associated solar array degradation during the simulation.

20. The apparatus of claim 15, wherein the at least one processor is further configured to:

model SEP propulsion utilizing either direct-drive or traditional power processing unit architectures;

determine thruster specific impulse ($I_{sp}$) as a function of solar array voltage in direct drive mode; and/or model electric propulsion modes comprising constant current operation, constant voltage operation, and/or peak-power tracking.

* * * * *